June 2, 1959 R. E. SLACK 2,889,532

WIRING ASSEMBLY WITH STACKED CONDUCTOR CARDS

Filed Sept. 4, 1956 3 Sheets-Sheet 1

*INVENTOR.*
ROBERT E. SLACK

*BY* Dewey J. Cunningham
ATTORNEY

June 2, 1959 R. E. SLACK 2,889,532

WIRING ASSEMBLY WITH STACKED CONDUCTOR CARDS

Filed Sept. 4, 1956 3 Sheets-Sheet 2

June 2, 1959 R. E. SLACK 2,889,532

WIRING ASSEMBLY WITH STACKED CONDUCTOR CARDS

Filed Sept. 4, 1956 3 Sheets-Sheet 3

2,889,532

WIRING ASSEMBLY WITH STACKED CONDUCTOR CARDS

Robert E. Slack, Johnson City, N.Y., assignor to International Business Machines Corporation, New York, N.Y., a corporation of New York Application September 4, 1956, Serial No. 607,610

2 Claims. (Cl. 339—18)

Figure 1:
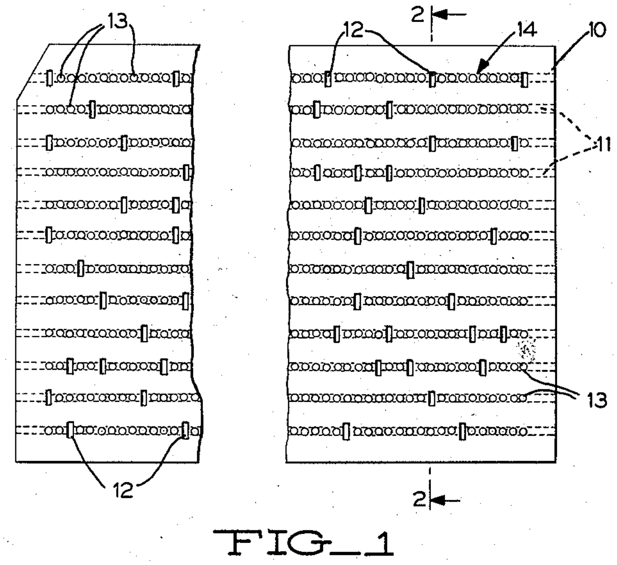

The present invention relates to electrical wiring assemblies, particularly those utilizing metallized wiring techniques for making circuit interconnections.

With the advent of metallized wiring techniques, it was found that the interconnection of a large number of electrical components could be handled on an automatic or semiautomatic basis. The interconnections are usually produced by a number of conductors which are formed on both sides of an insulating panel. In forming these conductors in the proper configuration, the designer takes the circuit to be formed and lays it out as two separate drawings, there being one drawing of the circuit interconnections for one side of the insulating panel and another drawing of the circuit interconnections for the other side of the insulating panel. In laying out the drawings for both sides, terminals may be provided for interconnecting the circuits on one side with those on the other side, thereby affording crossing connections. After the drawings are prepared they are photographically reduced in size to the size of the insulating panel. The insulating panel is provided with a conductive foil on both sides thereof. A light sensitive emulsion is spread evenly over the foil and dried. Thereafter, negatives of the circuit layout drawings are positioned on the proper side of the panel and each is exposed to a source of ultra-violet light. Those areas under the opaque portions of the negative will not receive light. However, the areas of the negative which represent the circuit pattern will allow the light to pass therethrough and harden the light sensitive emulsion in the pattern of the conductors. After exposure, the panel is developed and the areas of the panel not covered by the hardened emulsion are etched away, leaving the conductors intact on the panel. The connections from one side of the panel to the other may be made in any one of several ways.

There are other methods of producing these circuit panels, one of which is disclosed in application Serial No. 518,462, which was filed on June 28, 1955, for J. H. Hauser and E. J. Lorenz and assigned to the assignee of the present invention. In this particular application, a method was disclosed for plating the walls of holes in the insulating panel to interconnect terminals on opposite sides of the panel.

Much time is involved in the layout of the drawings and also in the photographic work involved in producing the completed panel. Much care must be exercised in positioning the negatives on the insulating panel, as the terminals which connect one side to the other must be aligned. The photographic work must be carried out each time a panel is produced. In addition, any time the circuit is changed a new drawing must be prepared.

It is an object of the present invention to provide a new and improved electrical wiring assembly.

Briefly, the invention utilizes two basic types of printed circuit cards. One of the cards is arranged with a fixed member of parallel conductors which extend from one end of the card to the other. These conductors may be termed horizontal conductors. The other card is arranged with a fixed number of parallel conductors which extend from the top of the card to the bottom thereof. These conductors may be termed vertical conductors. In order to best utilize existing equipment, the size of each card is made such that it is the same as a standard accounting machine card. The over-all thickness of the printed circuit card is such that it can be used in standard accounting machine equipment. As is well known in the accounting machine field, such a card is capable of handling eighty columns of information, there being twelve index points in each column to provide a total of nine hundred and sixty index points in a single card. The number of conductors on the first and second described types of cards is standardized at twelve and eighty, respectively. A group of these cards may be stacked together to form a complex electrical interconnection system by prepunching the cards for the purpose of establishing open circuits within certain ones of the conductors, and thereafter making appropriate connections between the conductors of adjacent cards.

The primary object of this invention is to furnish an improved construction for producing complex electric wiring interconnections.

Another object of the present invention is to produce a complex pattern of electrical wiring by means of a stack of cards having standardized metallized wiring patterns thereon, which cards have been prepunched before assembly in a manner suitable for forming a particular pattern of wiring.

Still another object of this invention is to provide a new and improved electrical wiring assembly composed of a stack of cards having one or more different standardized patterns of metallized conductors thereon, a conductor on one card being interconnected with one or more conductors on another card in a manner to form an electrical circuit through the stack of cards.

A further object of this invention is to provide an improved electrical wiring assembly as described in the paragraph above in which the metallized conductors are one side of a card and the card itself serves as the insulator between the metallized conductors on adjacent cards.

A still further object of this invention is to provide an improved wiring assembly as described above in which the metallized conductors on one card extend in a direction which is normal to the metallized conductors on an adjacent card.

Other objects of the invention will be pointed out in the following description and claims and illustrated in the accompanying drawings, which disclose, by way of examples, the principle of the invention and the best mode, which has been contemplated, of applying that principle.

Figure 2:
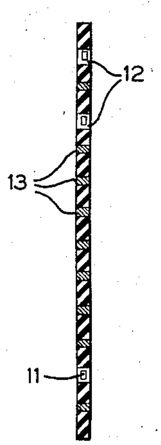
Figure 3:
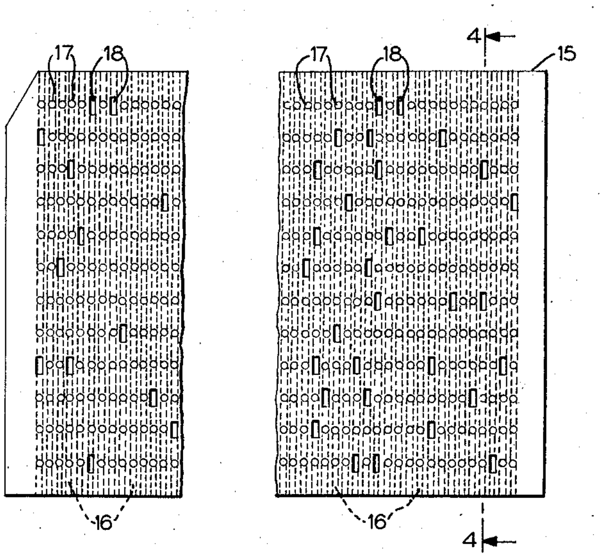
Figure 4:
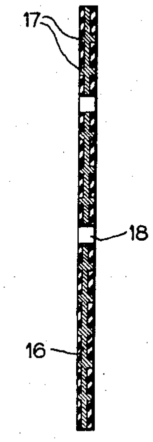
Figure 5:
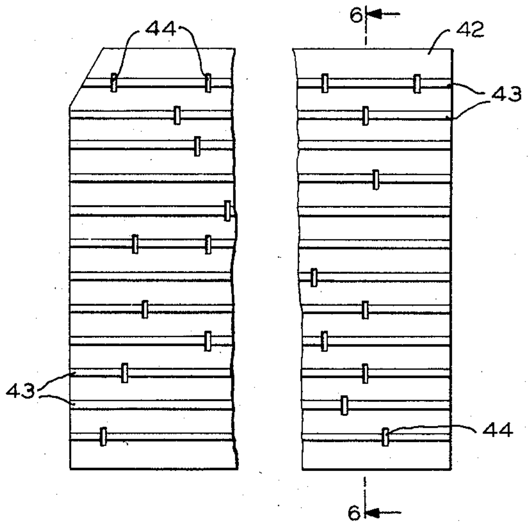
Figure 6:
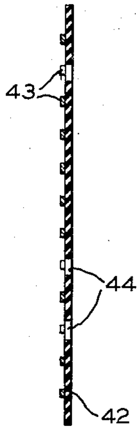
Figure 7:
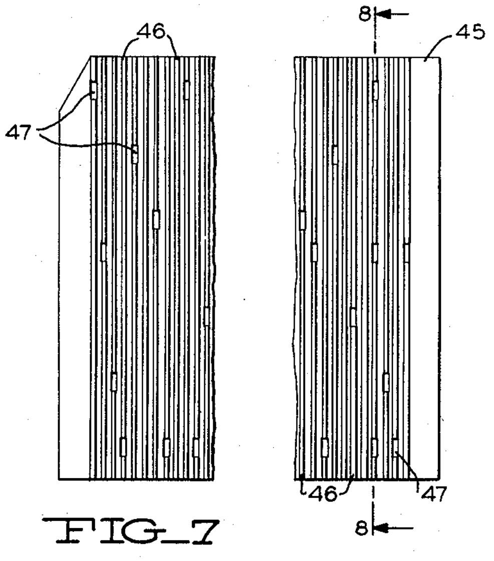
Figure 8:
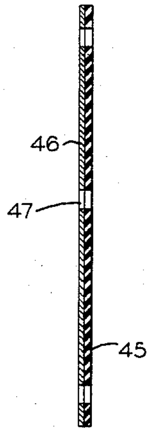
Figure 9:
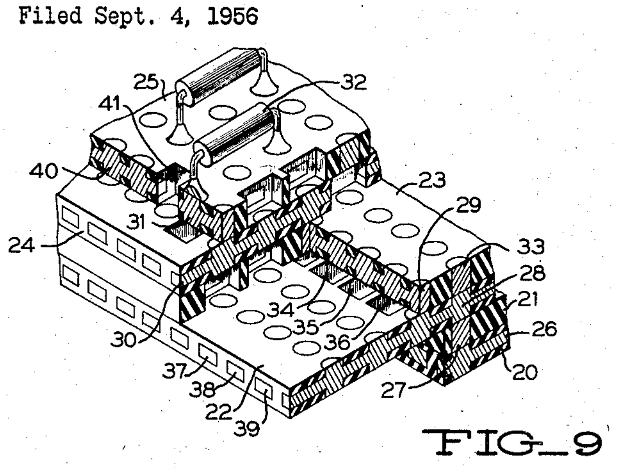
Figure 10:
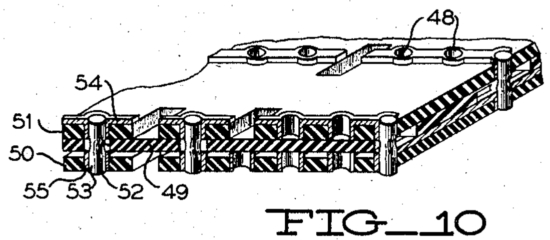
Figure 11:
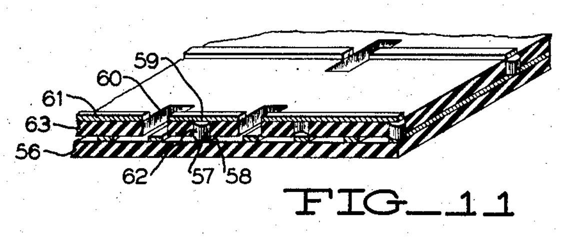

In the drawings:

Figs. 1 and 3 are plan views of the two types of metallized conductor cards usable in a first form of the invention;

Figs. 2 and 4 are sectional views taken on lines 2—2 and 4—4, respectively, of Figs. 1 and 3, respectively;

Figs. 5 and 7 are plan views of the two types of metallized conductor cards usable in a second form of the invention;

Figs. 6 and 8 are sectional views taken on lines 6—6 and 8—8, respectively, of Figs. 5 and 7, respectively;

Fig. 9 shows a portion of an assembly of a plurality of the metallized conductor cards shown in Figs. 1 through 4, parts of the individual cards being broken away and shown in section to illustrate the manner in which a conductive path may be formed;

Fig. 10 shows a portion of an assembly of a plurality of the metallized conductor cards shown in Figs. 5 through 8, parts of the individual cards being broken away and shown in section to illustrate the manner in which a conductive path may be formed; and Fig. 11 shows a portion of an assembly of a plurality of the metallized conductor cards shown in Figs. 5 through 8, parts of the individual cards being broken away and shown in section to illustrate the manner in which a conductive path may be formed, this particular figure being different from that shown in Fig. 10 as to the manner of making the circuit connections between the cards.

In Figs. 1 and 2, there is illustrated one of the two cards required to form a first embodiment of the invention. The card 10, which is formed from a suitable insulating material such as plastic, has a plurality of equally spaced conductors 11 embedded therein, the conductors being parallel with respect to one another. While the size of the card may vary, the embodiment illustrated utilizes a card of the same size as that used in business machines. The conductors 11 are embedded in a manner to run in the same path as the rows do in the conventional business machine card. Thus there are provided twelve conductors, one for each row of the card. It will be noted that a plurality of perforations, such as illustrated by the reference numeral 12, may be provided at selected index points on the card. As previously mentioned, a standard business machine card is capable of having nine hundred and sixty index points. This means that where a card has twelve rows and eighty columns, there are nine hundred and sixty unique positions on the card. A perforation 12 may be provided in any of these index positions. It will also be seen that the conductors 11 have projections thereon which rise from the conductor to both the top and bottom surfaces of the card at each of the index points, these projections being illustrated by the reference numeral 13. In this manner, it is possible to have each of the projections 13 serve as a terminal. Thus in each conductor, there may be provided as many as eighty terminal points 13 and also as many as eighty perforations 12. The perforations in the card serve to interrupt the continuity of a conductor. That is, if it is desirable to use a particular section of a conductor, such as that shown at 14 in Fig. 1, the perforations at each end of the conductor portion 14 serve to isolate it from the remainder of the conductor. Thus a perforation is capable of completely interrupting the continuity of the conductor.

Referring to Figs. 3 and 4, there is illustrated a card 15 having a plurality of spaced conductors 16 thereon. These conductors run in a direction normal to the direction in which the conductors 11 run in the card shown in Fig. 1. A conductor is provided for each of the standard eighty columns of the conventional business machine card. Thus in each conductor, there may be provided as many as twelve terminal points 17 and also as many as twelve perforations 18. Here again, the perforations 18 may serve to isolate a particular section of a conductor from the remainder thereof, it being understood that the perforation is wide enough to completely interrupt the conductor.

It should be pointed out that the particular method utilized to embed the conductors, such as those illustrated by reference numerals 11 and 16, in the cards does not form a part of the present invention.

Reference is now made to Fig. 9 which discloses a portion of a metallized wiring assembly comprising a plurality of the cards 10 and 15 mounted in stacked relation. The normal manner of positioning the cards is to have first one of the cards having the horizontal conductors thereon and next one of the cards having the vertical conductors thereon. While only a portion of a completed assembly is illustrated and is shown to be comprised of only six cards, it will be understood that a greater or lesser number of cards could be utilized in forming a particular electrical assembly. Before mounting the cards in this stacked relation, it is necessary to analyze the circuit which it is desired to produce and arrive at a proper programming for the punch which is to perforate the cards to be used in the assembly. That is, it is necessary to place perforations at the proper index positions on each card where it is desired to break a circuit or to isolate a portion of the conductor from the remainder thereof. The punching operation may all be carried out in accordance with conventional card punching techniques using standard card punches.

As shown in Fig. 9, cards having reference numerals 20 through 25 are shown in stacked relation. The index positions in each card should be aligned in order to obtain the greatest utility of the present invention. There are several rules to follow in laying out a conducting path through a group of cards such as is shown. When it is desired to have a conductive path along a particular conductor from one index position to another, the cards on both sides of the conductive path should have perforations in the index positions between the two index positions to be connected. This prevents the surface terminals on the adjacent cards from making an electrical contact with the conductor. Any time it is desired to isolate a particular section of a conductor from the remainder thereof, it is but necessary to provide perforations in the index positions at the ends of the section to be isolated.

In the assembly illustrated in Fig. 9, a circuit path may be traced from the conductor 26 in card 20, through conductor 27 in card 21 to conductor 28 in card 22. Moving laterally along conductor 28, it is seen that it engages conductor 29 in card 23. The last-mentioned conductor is allowed to contact conductor 30 in card 24 which in turn makes contact with conductor 31 in card 25. By way of example, one side of an electrical component 32 is shown as being connected to one of the terminals at an index point along conductor 31. The connection of an electrical component to a particular conductor may be by any one of several ways. For example, the conductor 31 may be perforated at the index point or terminal point to allow the lead of the electrical component to be inserted therein for a later dip soldering operation. On the other hand, the component lead may be directly soldered or spot-welded to the terminal of the conductor.

It should be appreciated that branch circuit paths could be provided from the circuit path just described. For example, conductor 33 in card 23, which engages conductor 28 in card 22, could make a suitable connection with conductors in the cards adjacent thereto. Where it is desired to prevent branch circuits from association with a conductor, perforations may be provided at each of the index points on cards adjacent the conductor. For example, perforations 34, 35 and 36 in card 22 serve to prevent the engagement of the conductors 37, 38 and 39, respectively, with conductor 29 in card 23. It is also seen that conductor 31 in card 25 is isolated from conductor 40 by perforation 41.

The actual connection of the conductors on one card to those on an adjacent card may be by any one of several methods. By way of example only, the terminal points on each card may be cleaned and tinned with solder. After the cards are stacked together, they may be placed under pressure with sufficient heat applied to make the necessary connections between the terminals of the conductors. Each card, being made of suitable plastic, may be bonded adjacently by application of the amount of heat and pressure required to make terminal connections. Thus a rigid laminated structure will be formed.

It will be apparent that the present invention is particularly useful where it is desired to make a large number of circuit interconnections. For example, a stack of cards formed in the manner described may be used as a means for mounting a large number of electrical circuit components and to provide complex interconnections therebetween.

Referring now to Figs. 5 and 6, there is illustrated a card which is one of two cards utilized in a different form of the invention. The card 42 is provided with horizontal conductors 43 on the surface thereof. These conductors may be interrupted periodically where desired by perforations such as those illustrated by the reference numeral 44. The other card for use with the second embodiment of the invention is illustrated in Figs. 7 and 8. As shown, card 45 is provided with a plurality of vertical conductors 46, the perforation 47 being utilized to interrupt these conductors at any desired points. Here again, the conductors 46 from card 45 are positioned on the surface of the card.

Referring to Fig. 10, there is illustrated a first method of utilizing the cards having conductors on the surfaces thereof as shown in Figs. 5 through 8. As illustrated in Fig. 10, each of the cards is adapted to be perforated at all of the index positions therein by perforations which are different from those previously indicated by reference numerals 44 and 47. The perforations at the index points now being referred to are those such as shown at 48.

Once the perforations 48 are made in a card at each of the index positions, the walls of the perforation in the card itself may be metallized in a suitable manner. For example, the metallizing process may be in accordance with the Hauser and Lorenz application previously referred to. In the last-mentioned application, the walls of the perforations are provided with a graphite coating and thereafter all of the conductors and the graphite are sprayed with a suitable adhering metal. After this operation, the entire card may be dip soldered so that the conductors and the metal adhering to the walls of the perforations are suitably tinned. Thereafter, the card may be provided with perforations 44 and 47 in the manner previously described with respect to perforations 12 and 18 in the first embodiment. In order to determine where the connections will be made between the index points of adjacent cards, the embodiment shown in Fig. 10 utilizes an insulator card 49 which may be positioned between cards 50 and 51. It will be appreciated that other cards such as 50 and 51 could be provided, but in each case an insulator card such as that illustrated by the reference numeral 49 is to be placed therebetween. In order to select the points where a connection is to be made from an index point on one card to an index point on another card, the insulation card 49 is also adapted to be provided with suitable perforations at selected points. Thus for example, with the perforations in the insulator card such as shown by the reference numeral 52, a solder connection such as is shown at 53 may be made between the conductor 54 on card 51 and a conductor 55 on card 50. It will be appreciated from the above, and particularly in view of the description of Fig. 9, that any number of interconnections may be made between the adjacent cards of a stack of cards.

The cards forming a stack may be interconnected as they are formed by a suitable soldering technique. On the other hand, pellets of solder may be placed between cards 50 and 51 at each of the perforations in the insulator card 49. Thereafter, the entire stack of cards may be placed under pressure and heat to cause the solder pellets to melt and make connection between the terminals of adjacent metallized conductor cards. The cards may be simultaneously bonded into a laminated structure as described in the first embodiment.

The embodiment shown in Fig. 11 differs from that shown in Fig. 10 primarily in that it illustrates how the necessity of providing perforations of the type shown at 48 in Fig. 10 at all index positions of the cards may be eliminated. Cards 63 and 56 are each provided with conductors on the surface thereof, the conductors on the surface of one card being separated from the conductors on the surface of the adjacent card by the card itself. In other words, in the embodiment shown in Fig. 11, there does not exist a necessity for the insulating card such as was shown at 49 in Fig. 10. However, in the embodiment shown in Fig. 11, where it is desired to make a connection between a conductor on card 63 and a conductor on card 56, by way of example, card 63 is end milled to provide a well or hole such as shown at 57 in the card 63 to thereby allow a pellet of solder 62 to make a suitable connection between the conductor 58 on card 56 and the conductor 59 on card 63. Here again, for example, the perforation 60 may be utilized to interrupt the conductor 59 from conductor 61. As in the embodiments previously described, the embodiment shown in Fig. 11 is usable for making a large number of circuit interconnections of any degree of complexity.

In view of the description above, it will be apparent that there is provided an improved apparatus for making a large number of complex electrical circuit interconnections. By first utilizing two basic types of cards for a particular assembly and providing standardized conductor patterns thereon, it is possible to assemble these cards in a manner to form complex circuit interconnections. The perforations in the card, which may be placed therein by standard card punches, may be utilized for interrupting the continuity of the conductor so that only a selected portion thereof is utilized. In the apparatus shown, it is not necessary to perform an intricate photographic process each time a new circuit is desired to be produced. Furthermore, by allowing the cards to be stacked one on top of the other, a much more complex group of circuit interconnections may be provided than in the art presently known. In certain of the embodiments, particularly that shown in Fig. 10, it is possible to automatically program the points where interconnections between the conductors on one card and the conductors on an adjacent card are desired. Thus in this embodiment, it is only necessary to program the cards insofar as the perforations to be made therein and to program the insulator card so that suitable connections can be made between the remaining conductor segments.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. An electrical wiring assembly comprising a stack of first and second circuit cards in alternate order, each of said cards having a plurality of spaced parallel metallized conductors affixed thereto, the conductors on said first card extending in a direction normal to the conductors on said second card, said conductors being embedded interiorly of said card, there being a plurality of terminals along the length of each conductor which extend from the conductor to a point flush with a surface of the card, each of said cards having a plurality of perforations therein at predetermined terminal locations, each of said perforations being positioned in such a manner as to interrupt the continuity of a conductor in the card, and means for providing a connection between selected terminals on adjacent cards for producing a desired conductive path through the cards.

2. An electrical wiring assembly comprising a plurality of cards formed from an insulating material and mounted in stacked relation, said plurality of cards being composed of first and second standardized cards which are arranged in alternate relation, said first card having a plurality of metallized conductors embedded therein which are arranged in parallel rows along the length of the card, said second card having a plurality of metallized conductors embedded therein which are arranged in parallel rows along the width of the card, the arrangement being such that a grid pattern of metallized conductors is formed by the conductors embedded in said first and second cards with index points being formed at each intersection of a conductor in one card with a conductor in an adjacent card, terminal means integral with each of said conductors at each of said index points, said terminal means extending from the conductor to a point substantially flush with the opposite sides of the card, each of said cards having perforations therein at predetermined ones of said index points, each perforation being of such a size as to eliminate the terminal means at an index point and interrupt the continuity of the conductor with which the index point is associated, and means for making an electrical connection between selected ones of said terminal means on adjacent cards to form a desired conductive path through the cards.

References Cited in the file of this patent

UNITED STATES PATENTS

| | | |
|---|---|---|
| 2,019,625 | O'Brien | Nov. 5, 1935 |
| 2,433,384 | McLarn | Dec. 30, 1947 |
| 2,483,551 | Libman | Oct. 4, 1949 |
| 2,613,252 | Heibel | Oct. 7, 1952 |
| 2,613,287 | Geiger | Oct. 7, 1952 |
| 2,616,994 | Luhn | Nov. 4, 1952 |
| 2,752,537 | Wolfe | June 26, 1956 |